United States Patent
Dhanoa

(10) Patent No.: US 7,954,015 B1
(45) Date of Patent: May 31, 2011

(54) DATA INTERLEAVING AND DEINTERLEAVING INVOLVING CONCATENATION OF WORDS READ FROM STORAGE

(75) Inventor: Kulwinder Dhanoa, Windsor (GB)

(73) Assignee: Altera Corporation, San Jose, CA (US)

(*) Notice: Subject to any disclaimer, the term of this patent is extended or adjusted under 35 U.S.C. 154(b) by 244 days.

(21) Appl. No.: 12/315,772

(22) Filed: Dec. 5, 2008

(51) Int. Cl.
*G06F 11/00* (2006.01)

(52) U.S. Cl. ........ 714/701; 714/702; 714/761; 714/787; 711/217; 375/254; 375/285

(58) Field of Classification Search .................. None
See application file for complete search history.

(56) References Cited

U.S. PATENT DOCUMENTS

| | | | | |
|---|---|---|---|---|
| 4,559,625 A | * | 12/1985 | Berlekamp et al. | 714/701 |
| 5,907,560 A | * | 5/1999 | Spruyt | 714/701 |
| 6,009,544 A | * | 12/1999 | Nara | 714/701 |
| 6,202,178 B1 | * | 3/2001 | Spruyt | 714/702 |
| 6,658,605 B1 | * | 12/2003 | Yoshida et al. | 714/702 |
| 7,024,596 B2 | * | 4/2006 | Xin | 714/702 |
| 7,146,545 B2 | * | 12/2006 | Ohbuchi et al. | 714/701 |
| 7,440,392 B2 | * | 10/2008 | Hwang et al. | 370/208 |
| 2004/0114596 A1 | * | 6/2004 | Ha et al. | 370/389 |

* cited by examiner

*Primary Examiner* — John P Trimmings

(74) *Attorney, Agent, or Firm* — Mauriel Kapouytian & Treffert LLP; Ararat Kapouytian

(57) ABSTRACT

An apparatus for producing a word of a de-interleaved sequence of bits from a sequence of bits stored in a memory is described. In one embodiment, the apparatus includes a read circuit for selecting bits of the stored sequence and forming the selected bits into a word, and a logic network arranged to produce the word of the de-interleaved sequence by concatenating sections of a plurality of words produced by the read circuit. The technique can also be used to achieve interleaving, rather than de-interleaving, of a data sequence.

22 Claims, 6 Drawing Sheets

DATA INTERLEAVING AND DEINTERLEAVING INVOLVING CONCATENATION OF WORDS READ FROM STORAGE

BACKGROUND

This invention relates to the field of interleaving data bits and is particularly applicable to interleavers used in mobile telecommunications devices.

It is common in telecommunications systems for data to be interleaved prior to transmission in order to minimise the effect of burst errors on the data, thus increasing the probability that the data can be decoded when it is received. In a simple example, if the data to be transmitted comprises four eight-bit words, an interleaved data block may be generated by using the first bit of the first word as the first bit of the interleaved data block, with the first bit of the second word being used as the second bit of the interleaved data block, the first bit of the third word being used as the third bit of the interleaved data block and the first bit of the fourth word being used as the fourth bit of the interleaved data block. The second bit of the first word may then be used as the fifth bit of the interleaved data block, and so on, until a thirty-two bit interleaved data block has been generated. In this way, adjacent bits of the data to be transmitted do not appear adjacent to each other in the interleaved data block. Thus, in the event of a burst error which renders several successive bits of the transmitted interleaved data block unintelligible, it is possible that the transmitted data can still be recovered, as after de-interleaving the unintelligible bits are dispersed throughout the data block, and thus no individual word of the transmitted data has an extended sequence of unintelligible bits, which would prevent successful decoding of that word.

In certain newer telecommunications systems, such as the Long Term Evolution (LTE) of the Third Generation Partnership Program (3GPP) there is a requirement for transmitters and receivers to support high data throughput rates. This has placed strain on functional blocks, such as turbo decoders, which are used to perform channel decoding.

One method of improving data throughput rates is to use a plurality (typically two, four, eight or sixteen) of parallel processing engines to perform decoding operations within a turbo decoder, each of which processes a different subset of a sequence to be decoded. Interleaving (and de-interleaving) are used when passing sequences back and forth between constituent decoders within a turbo decoder.

Another method of improving the data throughput of a turbo decoder is to arrange its interleaving process to output multiple interleaved bits at a time (and to arrange, likewise, its de-interleaving process to output multiple de-interleaved bits at a time). Thus, simple bitwise interleaving and de-interleaving, as described above, are not employed.

In a typical turbo decoder de-interleaver, an interleaved data block of size k bits is written to memory in input words of p bits in length, and de-interleaved output words of s bits in length are extracted from the data block (where k, p, and s have integer values). The data block of size k can be considered as a two-dimensional array containing a plurality of rows and columns of bits, with the input words of length p bits being written to columns of the data block and the output words of length s bits being created from words constituted by rows read from the data block. In reality however, the data block is a one-dimensional sequence from which bits are read to form a de-interleaved output word.

A number of difficulties arise with such systems. Where the process of de-interleaving is carried out in an application specific integrated circuit (ASIC), programmable logic device (PLD), field programmable gate array (FPGA) or similar device, such a system gives rise to inefficient use of the limited on-chip memory resources of the device, as the data block containing data to be de-interleaved may occupy the resources of an entire memory block of the device, which memory block may have far more capacity than is required to store the data block. Additionally, systems of this type are limited in their speed of throughput, as it typically takes a number of clock cycles to generate a complete de-interleaved data word of the desired number of bits s. Also, to ensure that the bits which make up the de-interleaved data word are selected in the correct order, look up tables may be employed, which may occupy a large amount of memory. In the example of 3GPP LTE turbo decoding, there, are 288 different values for k, ranging from 40 to 6144, and p may be 1, 2, 4, 8 or 16. Thus it will be appreciated that even if the value of s is fixed at 8, there are a large number of de-interleaving patterns that must be stored in look up tables.

SUMMARY

According to a first aspect of an embodiment of the invention, there is provided an apparatus for producing a word of a de-interleaved sequence of bits from a sequence of bits stored in a memory. The apparatus includes a read circuit for selecting bits of the stored sequence and forming the selected bits into a word and a logic network arranged to produce the word of the de-interleaved sequence by concatenating sections of a plurality of words produced by the read circuit.

In an apparatus according to an embodiment of the invention, a complete de-interleaved data word can be generated from input data bits more quickly than in prior art systems whilst avoiding the use of look up tables, which reduces memory requirements.

A section of a word produced by the read circuit which is not used to produce the word of the de-interleaved sequence may be stored for use in producing a later word of the de-interleaved sequence. In this way, the apparatus avoids performing unnecessary read operations, saving time and processing resources.

The memory may be spread over a plurality of separate memory instances. By using a plurality of memory instances in this way the memory resources of the apparatus can be used efficiently, as the memory need not occupy the memory capacity of a large memory instance, which may result in an unusable surplus of memory in that memory instance, but instead occupies the memory resources of a plurality of smaller memory instances, each of which may be left with a smaller surplus, if any, of unusable memory.

The logic network may include a marshalling logic circuit for selecting and positioning bits to be de-interleaved and a concatenation logic circuit for concatenating the bits to produce the word of the de-interleaved sequence. The marshalling logic circuit may include a masking element for selecting bits to be de-interleaved. The marshalling logic circuit may include a shifting element for shifting bits to be de-interleaved. The marshalling logic circuit may include a further masking element for selecting positioned bits.

The concatenation logic circuit may include a register for storing a section of a word formed by the read circuit which is not used to produce the word of the de-interleaved sequence.

A plurality of marshalling logic circuits may be provided, each marshalling logic circuit being configured to select and position bits of a different word formed by the read circuit.

Each of the marshalling logic circuits may be substantially identical.

According to a second aspect of an embodiment of the invention, there is provided a method of producing a word of a de-interleaved sequence of bits from a stored sequence of bits. The method comprises selecting bits of the stored sequence and forming the selected bits into a word, and concatenating sections of a plurality of words so formed to produce the word of the de-interleaved sequence.

A word formed from the stored sequence of bits which is not used to produce the word of the de-interleaved sequence may be stored for use in producing a later word of the de-interleaved sequence.

The stored sequence of bits may be stored in a memory which is spread over a plurality of separate memory instances.

Bits to be de-interleaved may be selected and positioned by a marshalling logic circuit and the bits may be concatenated by a concatenation logic circuit to produce the word of the de-interleaved sequence. Bits to be de-interleaved may be selected by a masking element. The bits to be de-interleaved may be positioned by a shifting element. Positioned bits may be selected by a further masking element.

A section of a word formed by the read circuit which is not used to produce the word of the de-interleaved sequence may be stored in a register of the marshalling logic circuit.

A plurality of marshalling logic circuits may be operative to select and position bits of a different word formed from the stored sequence. Each of the marshalling logic circuits may be substantially identical.

According to a third aspect of an embodiment of the invention, there is provided apparatus for producing a word of length s bits of a de-interleaved version of a data block comprising a series of original words of length p bits. A memory is provided to store the data block. A read circuit is provided to read from the memory a bit of a word at an end of the series, read each succeeding $p^{th}$ bit thereafter in the series as is necessary to read s bits altogether. The read circuit is arranged to deliver these s bits as an intermediate word. A logic network is provided to concatenate sections of intermediate words delivered by the read circuit to produce said word of the de-interleaved version of said block.

According to a fourth aspect of an embodiment of the invention, there is provided a method of producing a word of length s bits of a de-interleaved version of a data block including a series of original words of length p bits. The data block is stored into a memory. From the memory is read a bit of the word at an end of the series. Each succeeding $p^{th}$ bit thereafter in the series is read as is necessary to read s bits altogether. These s bits are delivered as an intermediate word. Sections of intermediate words are concatenated to produce said word of the de-interleaved version of said block.

Embodiments of the invention are discussed in this document primarily in terms of implementing a de-interleaving process. However, it is to be understood that both interleaving and de-interleaving are simply the re-ordering of a data sequence from an original order to a new order in accordance with a predetermined reordering pattern. Therefore, the difference between interleaving and de-interleaving is one of terminology rather than one of technology and it is to be understood that the appended claims, despite their reference to de-interleaving processes, also cover interleaving processes.

BRIEF DESCRIPTION OF THE DRAWINGS

The novel features of the invention are set forth in the appended claims. However, for purpose of explanation, several aspects of particular embodiments of the invention are described by reference to the following figures:

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
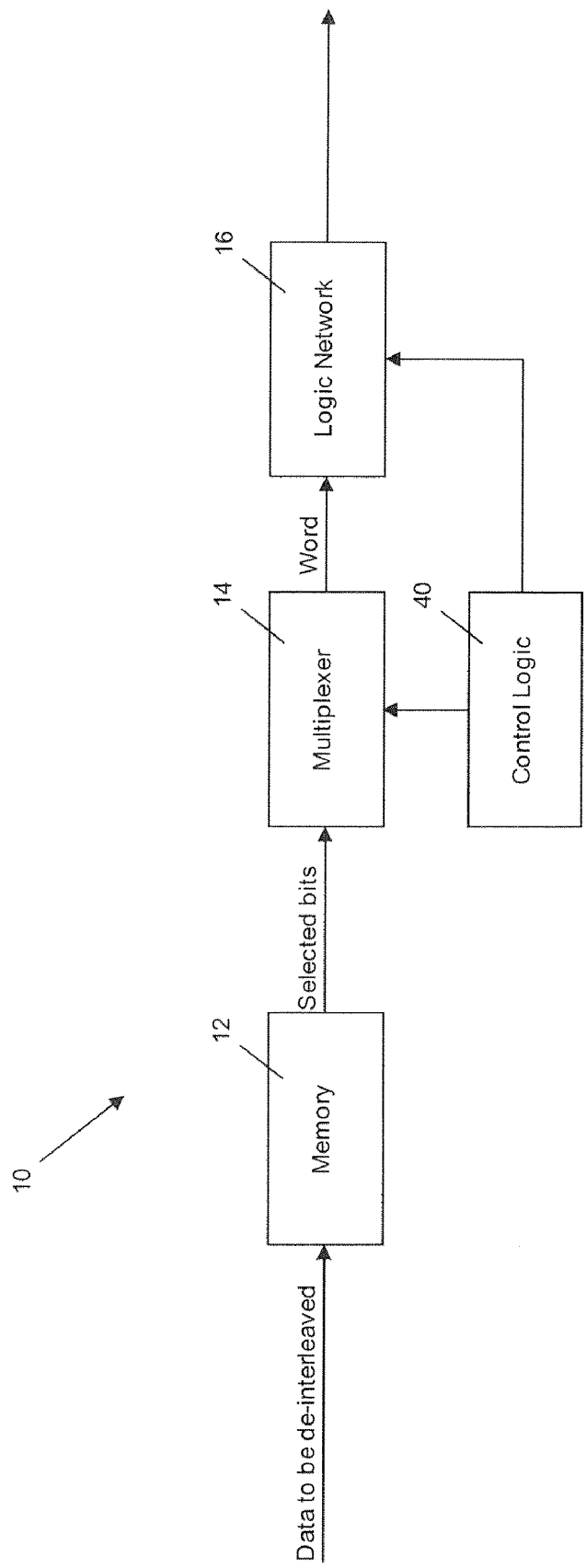
FIG. 1 is a schematic diagram showing functional blocks of an architecture for producing a de-interleaved sequence of data bits.

Referring first to FIG. 1, an architecture of an ASIC for producing a de-interleaved sequence of data bits is shown generally at 10. The architecture 10 includes a memory 12 in which a data block of size k bits that is to be de-interleaved can be stored. The architecture 10 also includes a multiplexer block 14 (which may also herein be referred to as a read circuit 14), a logic network 16, and a control logic 40 (which may also herein be referred to as controller 40), connected as shown. In one embodiment, the multiplexer block 14 includes a multiplexer 42 and a multiplexer 46 (both shown in FIG. 4). The multiplexer 42 is arranged to read from the memory 12 a sequence 44 (also shown in FIG. 4) of data bits that includes the data block. Also in one embodiment, the multiplexer 46 draws bits from the sequence 44 to create words that are manipulated by the logic network 16 to produce words of a de-interleaved version of the data block. The nature of the logic network 16 will be described in more detail shortly. The multiplexers 42, multiplexer 46, and the logic network 16 all operate under the control of a controller 40, and words produced by the multiplexer 42 are subsequently processed by the logic network 16 to produce words of the de-interleaved sequence of data bits, as will be described in detail below.

Figure 2:
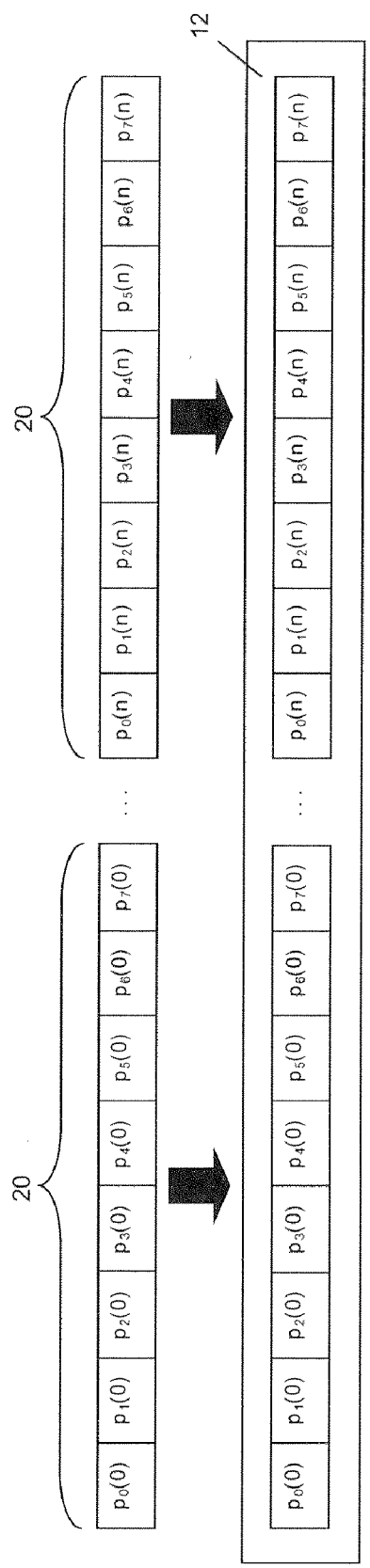
FIG. 2 is a schematic diagram showing input of data to memory.

The data block of k bits to be de-interleaved consists of a sequence of contiguous words, each of length p, and these are, as is illustrated schematically in FIG. 2, loaded into the memory 12 sequentially, commencing at the memory's lowest address. The memory 12 has a capacity of at least s×p bits, and its locations above and beyond those occupied by the data block are with zero-valued bits. Thus, a plurality of words of length p bits are stored in the memory 12 as a single sequence of bits. The memory 12 in this example is located in a single instance of memory in the architecture 10. However, in another embodiment, the memory 12 is spread across a plurality of memory instances.

In the example shown in FIG. 2, the words 20 in the data block that are presented for de-interleaving (hereinafter called "input words") are 8 bits long (i.e., p=8). However, it will be appreciated that the input words may be of any appropriate length. In the case where the architecture 10 is used in a turbo decoder for use in decoding signals which comply with the requirements of the 3GPP LTE specification, the length p of the input words 20 may be two bits, four bits, eight bits or sixteen bits. In the 3GPP LTE system, for example, the data block size k may be any one of 188 values ranging from 40 to 6144 bits.

The input words 20 are written to memory 12 one word at a time, that is to say one input word of length p bits occupies p consecutive bits of the memory 12. For example, the input word comprising the bits $p_0(0)$, $p_1(0)$, $p_3(0)$, $p_4(0)$, $p_5(0)$, $p_6(0)$, $p_7(0)$ occupies the first eight bits of the memory 12 in the example illustrated in FIG. 2.

The de-interleaving of the bits of the data block is performed in a rectangular fashion, that is to say by reading and concatenating sections from rows of a notional rectangular array of input bits. For example, where the length p of the input word is eight bits, data is input to the memory 12 eight bits at a time. Each input word may be thought of as forming a column of a rectangular array of memory, although in reality of course each input word makes up part of a single sequence of bits stored in the memory 12, as shown in FIG. 2. If the size of the data block is k=40 bits, for example, the data block can be thought of as a rectangular array of eight rows by five columns; as is shown schematically in FIG. 3.

De-interleaving of the input data bits is achieved by reading data from the notional rectangular array. Thus, in the example shown in FIG. 3, a de-interleaved output word 22 of length eight bits may be comprised of the entire top row (bits $p_0(0)$, $p_0(1)$, $p_0(2)$, $p_0(3)$, $p_0(4)$) and the first three bits of the second row (bits $p_1(0)$, $p_1(1)$, $p_1(2)$) of the two-dimensional array, as is indicated by the dashed outline 24. In more general terms, the de-interleaved output word 22 is of length s bits, and s may be equal to, greater than or less than the length p of the input words.

Figure 3:
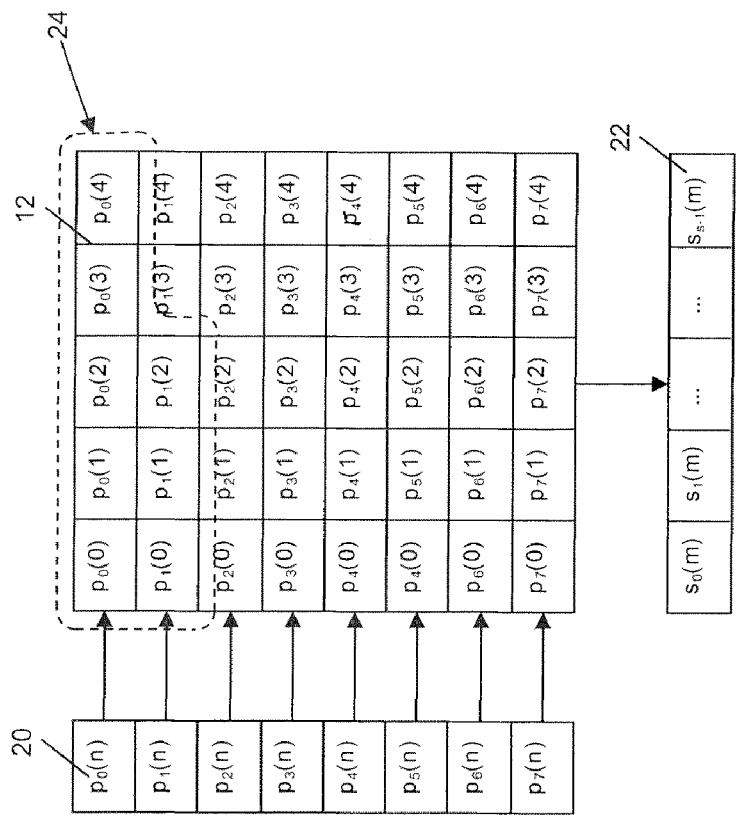
FIG. 3 is a schematic diagram illustrating how the memory shown in FIG. 2 can be regarded as a two-dimensional array.

Of course, the bits of the data block are not actually stored in a rectangular array, and thus to generate the word shown by the dashed outline 24 in FIG. 3 as the de-interleaved output word 22, the first, ninth, seventeenth, twenty-fifth, thirty-third, second, tenth and eighteenth bits in the memory 12 are read and concatenated. The bits may be read in any order, with appropriate bit-shifting, masking, rotation and the like being employed to marshal the bits into the correct order to form the de-interleaved output word.

It will be appreciated that selecting the correct data bits from the memory 12 to construct the de-interleaved output word 22 and assembling the selected data bits in the correct order is not a trivial task. In known systems look up tables may be used to store the position, order and number of bits required from the memory to construct the de-interleaved output words 22. However, in cases where the length p of the input words, and/or the length s of the de-interleaved output words 22 and/or the data block size k can vary, such as in a system for use in an 3GPP LTE turbo decoder, a large number of look up tables is required, each look up table having a large number of entries, which requires a large amount of memory.

Figure 4:
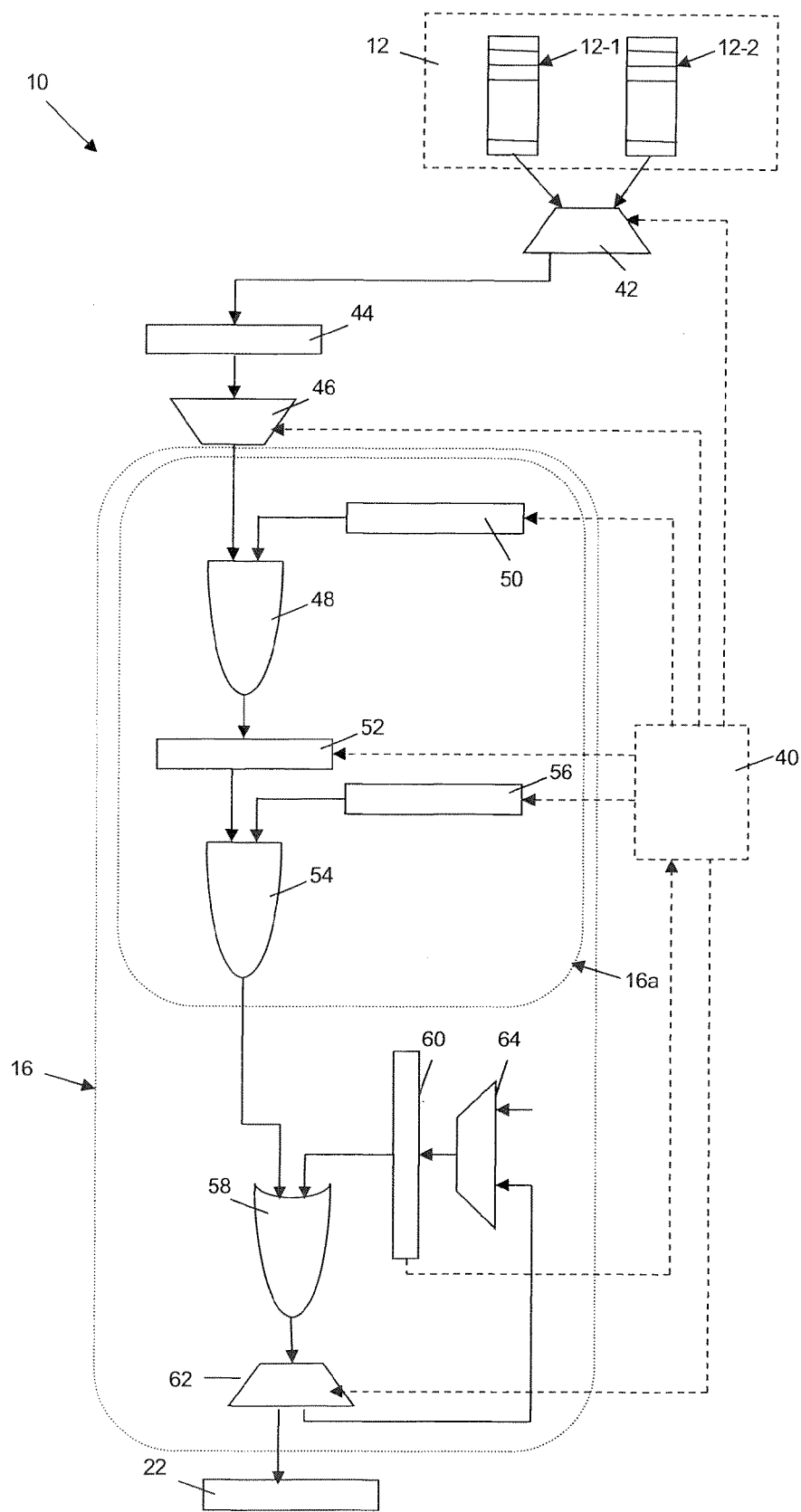
FIG. 4 is a schematic diagram showing an exemplary logic network that can be used to construct an output de-interleaved word from portions of words read from a memory.

Referring to FIG. 4, the architecture 10 avoids this problem by using the logic network 16 (indicated in dotted outline) to construct the de-interleaved output word 22 by assembling data bits read from the memory 12 into the correct order. As can be seen in FIG. 4, the memory 12 is spread over memory instances 12-1 and 12-2. It is to be noted that, more generally, the memory 12 may be spread over any plurality of memory instances. The logic network 16 is controlled by the controller 40, which may be, for example, a microprocessor executing suitable instructions, a PLD or any other suitable device. The controller 40 determines the number and order of the data bits of the memory which are used to construct the de-interleaved output word 22, as will be described below.

The architecture 10 includes a first multiplexer 42 which reads from the memory 12 in a single read operation a sequence 44 of s×p bits commencing with the k bits of the data block and followed by as many zero-valued bits as necessary to give the sequence length s×p. A second multiplexer 46 is configured to read from the sequence 44 a word of length s bits. The controller 40 determines which bits of the s×p bit sequence are read by the second multiplexer 46 depending upon the required de-interleaved output word.

In describing the function of the second multiplexer 46, it is convenient to adopt the numbering convention that labels the least significant bit of the sequence 44 as the $1^{st}$, rather than the $0^{th}$, bit of the sequence. The second multiplexer 46 is controlled by controller 40 so as to be capable of delivering at a given instant one of p words each of length s bits. Each of these p words commences with a different one of the p least significant bits of the sequence 44. Where a word delivered by the second multiplexer 46 commences with the $a^{th}$ bit of the sequence 44 (where a has an integer value), then that word is specified by the series commencing with the $a^{th}$ bit of sequence 44 and including every $p^{th}$ bit thereafter as is necessary to give the delivered word a length of s bits.

Taking the example of FIG. 3, one has k=40 and s=p=8 so it should be apparent that any word delivered by the second multiplexer 46 will have three zero-valued bits at its most significant end. As a more detailed example, consider that the k=40 data block of FIG. 3 is to be de-interleaved and that the controller 40 calls on the second multiplexer 46 to deliver its output word for the case a=1 (as part of the process of assembling the word indicated by boundary 24 as the de-interleaved output word 22). In this case, the word delivered by the second multiplexer 46 is the sequence $p_0(0)$, $p_0(1)$, $p_0(2)$, $p_0(3)$, $p_0(4)$, 0, 0, 0. As this is not a valid complete de-interleaved output word, additional logic operations must be carried out on it to construct the desired de-interleaved output word correctly.

To this end, the logic network 16 includes an AND gate 48. One input of the AND gate 48 is connected to a register 50 which contains a bit mask, whilst the other input of the AND gate 48 receives the word read by the second multiplexer 46. The AND gate 48 performs a bit-wise AND operation on its inputs. The bit mask stored in the register 50 is dependent upon the s bit word read by the second multiplexer 46 and is determined by the controller 40 in response to flags set by the logic network 16, as will be described below.

The word output by the AND gate 48 is input into a rotate register 52 which causes the bits of the word to be shifted, if necessary, such that they occupy the correct positions in the output de-interleaved word 22. Again, the shifting operation of the rotate register 52 is dependent upon the s bit word read by the second multiplexer 46 and is determined by the controller 40 in response to flags set by the logic network 16, as will be described below.

The word output by the rotate register 52 is input into a second AND gate 54, whose other input is connected to a register 56 containing a further bit mask. The AND gate 54 performs a bit-wise AND operation on its inputs. The purpose of the bit mask is to remove bits of the word which are not required in the de-interleaved output word 22. The bit mask stored in the register 56 is dependent upon the word read by the second multiplexer 46 and is determined by the controller 40 in response to flags set by the logic network 16, as will be described below.

The output of the second AND gate 54 is input into an OR gate 58, whose other input is connected to a pre-output register 60 which contains a word of size s bits. The contents of the pre-output register 60 are dependent upon previous actions of the logic network 16, as will be described below. The OR gate 58 performs a bit-wise OR operation on its inputs.

The s bit word output by the OR gate 58 is input to a demultiplexer 62, whose contents are provided either as the s bit de-interleaved output word 22 or are fed into the pre-output register 60, via a multiplexer 64, depending upon whether the controller 40 determines that a complete de-interleaved output word 22 has been constructed, as will be described below.

Figure 5:
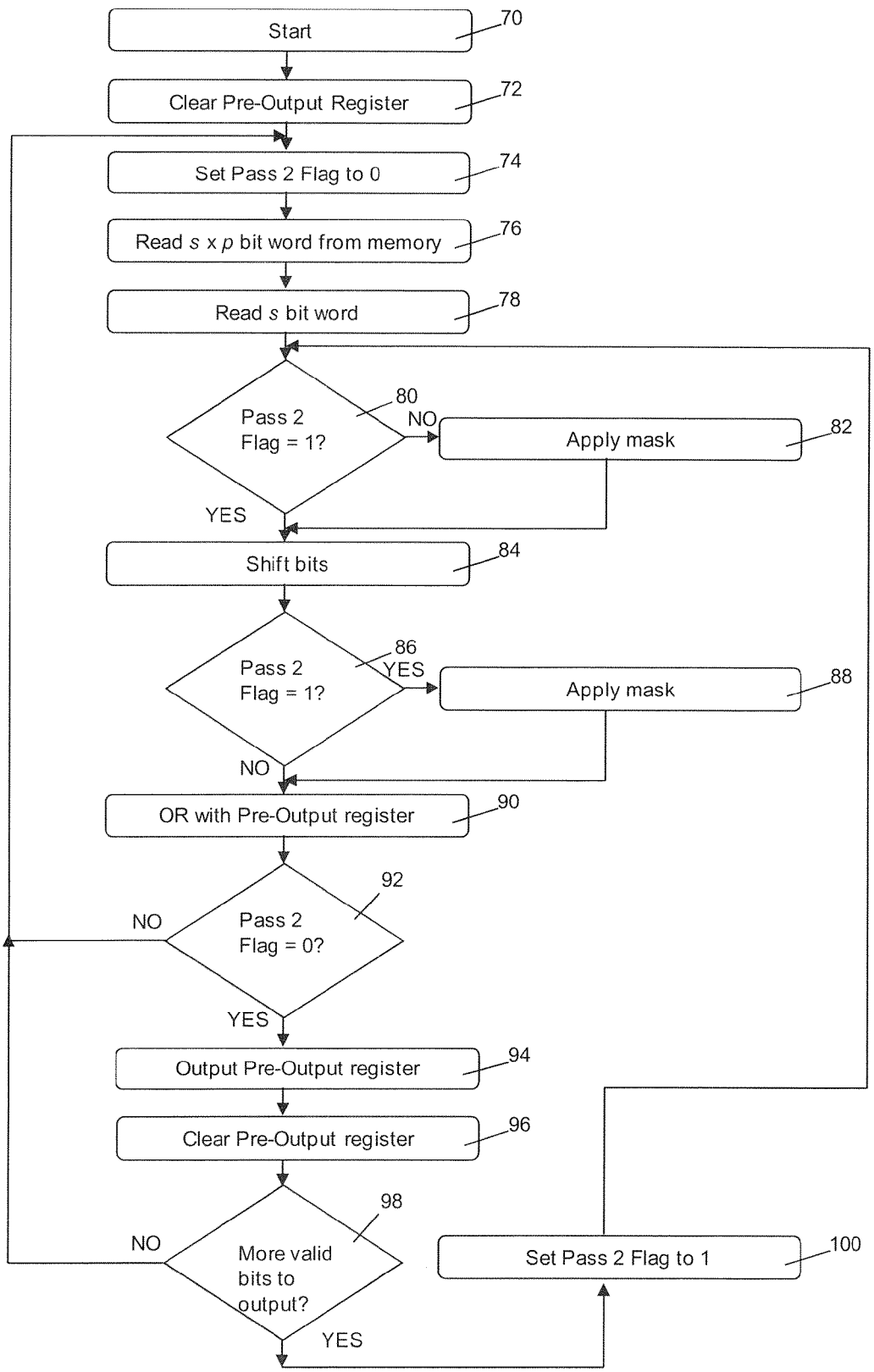
FIG. 5 is a flow diagram illustrating steps taken by the architecture in generating a de-interleaved output word.

The operation of the logic network 16 will now be described with reference to the flow diagram of FIG. 5, taking as an example the case where the word indicated by boundary 24 is initially to be supplied as the de-interleaved output word 22.

The process of generating the s bit (in this case eight bit) long de-interleaved output word 22 commences at step 70. Steps 72 and 74 initialise the logic network 16 and the controller 40 to commence the processing of the sequence 44 to generate the de-interleaved output word 22. Thus, at step 72 the pre-output register 60 is cleared, whilst at step 74 a "Pass 2" flag in the controller 40 is set to 0. The Pass 2 flag is used to indicate whether the word extracted by the multiplexer 46 contains valid data bits that do not form part of the current de-interleaved output word 22. If the Pass 2 flag is set to 0, it indicates that the word extracted by the multiplexer 46 does not contain valid data bits that do not form part of the current de-interleaved output word 22. If the Pass 2 flag is set to 1, it indicates that the word extracted by the multiplexer 46 does contain valid data bits that do not form part of the current de-interleaved output word 22.

At step 76, the demultiplexer 42 reads an s×p bit word from the memory 12. At step 78 the second multiplexer 46 reads the s bit word for the a=1 case from the sequence 44 read by the first multiplexer 42. Thus, the word read by the second multiplexer 46, under the control of the controller 40, contains the five valid data bits $p_0(0)$, $p_0(1)$, $p_0(2)$, $p_0(3)$, $p_0(4)$ and three "padding" bits, which are set to zero. Thus, the eight-bit word output by the multiplexer 46 at step 78 comprises the bits $p_0(0)$, $p_0(1)$, $p_0(2)$, $p_0(3)$, $p_0(4)$, 0, 0, 0.

A check is made by the controller 40 at step 80 to evaluate the Pass 2 flag. In this case the logic network 16 is processing an eight bit word whose valid data bits are the bits of the topmost row of the array-arranged data block shown in FIG. 3. All of the valid data bits in the eight bit word being processed form part of the current de-interleaved output word 22, so the Pass 2 flag is set to zero.

The valid data bits read by the second multiplexer 46 at step 78 are in the correct positions, so there is no need to alter the data bits or the padding bits. Hence, the mask in the register 50 is set by the controller 40 to an s (i.e., eight) bit word in which all of the bits are set to logic 1. Thus, when the mask is applied in the AND gate 48 at step 82, the output of the AND gate 48 is identical to the eight-bit word output by the multiplexer 46 at step 78, i.e., comprises the bits $p_0(0)$, $p_0(1)$, $p_0(2)$, $p_0(3)$, $p_0(4)$, 0, 0, 0.

This eight bit word is input to the rotate register 52. As the valid data bits $p_0(0)$, $p_0(1)$, $p_0(2)$, $p_0(3)$, $p_0(4)$ are in the correct positions, the bits are not rotated, i.e., a rotation of 0 bits is applied at step 84.

The output of the rotate register 52 is input to the second AND gate 54, whose other input receives a bit mask which is stored in a register 56. As is explained above, the purpose of the bit mask is to remove valid bits of the word which are not required in the de-interleaved output word 22. The controller 40 evaluates the Pass 2 flag at step 86 to determine whether the word contains valid bits which are not required in the de-interleaved output word. In this instance, the Pass 2 flag is set to zero, and as all of the valid data bits of the word are required in the de-interleaved output word, the bit mask stored in the register 56 is set to an s (i.e., eight) bit word in which all of the bits are set to logic 1, such that the output of the second AND gate 54 is identical to the eight bit input word.

At step 90, the output of the second AND gate 54 is input to the OR gate 58, whose other input is connected to the pre-output register 60. In this instance, the pre-output register 60 contains an eight bit word in which all the bits are set to logic 0. Thus, the output of the OR gate 58, which is fed to the demultiplexer 62, is identical to the output of the second AND gate 54, and in this instance comprises the valid data bits $p_0(0)$, $p_0(1)$, $p_0(2)$, $p_0(3)$, $p_0(4)$, and the three invalid bits of value 0.

The controller 40 checks, at step 92, whether there are sufficient valid data bits in the output word of the demultiplexer 62 to form a de-interleaved output word 22. In this case there are not, as there are only five valid data bits. The output word of the demultiplexer 62 is therefore stored into the pre-output register 60. Three additional valid data bits are required to form a de-interleaved output word 22.

Processing returns to step 74, such that the sequence 44 is re-read from the memory 12. At step 78, the second multiplexer 46, under the control of the controller 40, delivers the word for a=2. Thus, the second eight bit word read by the second multiplexer 46 contains the five valid data bits $p_1(0)$, $p_1(1)$, $p_1(2)$, $p_1(3)$, $p_1(4)$ followed by the three zero-value padding bits.

Only the first three bits are required to construct the current de-interleaved output word. Thus the controller 40 sets the s bit mask stored in the register 50 to 1, 1, 1, 0, 0, 0, 0, 0, so that when the bit mask is applied at step 82 in the AND gate 48, only the first three data bits of the word are maintained, with the remaining five bits being set to zero.

These three valid data bits are incorrectly positioned, as they occupy the first three bits of the word, whereas they should occupy the last three bits in order to be appended correctly to the five valid data bits previously extracted, which are stored in the pre-output register 60. Thus, at step 84 the rotate register 52, under the control of the controller 40, shifts the bits to the right by five bit positions, such that they occupy the last three bits of the word.

At step 86, the controller 40 evaluates the Pass 2 flag. In this case, the Pass 2 flag is set to 0, so processing passes to step 90, in which the word containing the three shifted data bits is input to the OR gate 58. The other input of the OR gate 58 is connected to the pre-output register 60 which contains the word $p_0(0)$, $p_0(1)$, $p_0(2)$, $p_0(3)$, $p_0(4)$, 0, 0, 0. Thus, the output of the OR gate 58 is an eight bit word containing the data bits $p_0(0)$, $p_0(1)$, $p_0(2)$, $p_0(3)$, $p_0(4)$, $p_1(0)$, $p_1(1)$, $p_1(2)$.

The controller 40 assesses whether the output of the OR gate 58 is a valid de-interleaved output word 22, at step 92. In this case, the word is a valid de-interleaved output word, so the word is output, at step 94. As a valid de-interleaved output word 22 has been generated, the pre-output register 60 is cleared at step 96, in preparation for the next processing operation.

At step 98, the processor checks whether the word extracted by the multiplexer 46 contained valid data bits which were not used in the de-interleaved output word 22. In this case, the word contained the unused data bits $p_1(3)$ and $p_1(4)$. Thus, at step 100, the processor sets the Pass 2 flag to 1, to indicate this, before returning processing to step 80.

At step 84, the bits of the eight bit word are shifted by the rotate register 52 such that the data bits $p_1(3)$ and $p_1(4)$ occupy the first two positions in the eight-bit word. A mask of 1, 1, 0, 0, 0, 0, 0, 0, determined by the controller 40 and stored in the register 56, is then applied by the second AND gate 54 at step 88 to remove the other data bits from the bit-shifted eight bit word, such that the data bits $p_1(3)$ and $p_1(4)$ can be stored in the first two bit positions of the eight-bit pre-output register 60.

Processing then returns to step 74, where the Pass 2 flag is reset to 0 and then multiplexer 46 delivers its output for the case a=3. Appropriate masking and bit-shifting is applied at steps 82 and 84 such that the five data bits $p_2(0)$, $p_2(1)$, $p_2(2)$, $p_2(3)$, $p_2(4)$ occupy the third to seventh bit positions of an eight bit word, which is combined with the data bits $p_1(3)$ and $p_1(4)$ stored in the pre-output register 60 by the OR gate 58. Thus, an eight bit word containing the bits $p_1(3)$, $p_1(4)$, $p_2(0)$, $p_2(1)$, $p_2(2)$, $p_2(3)$, $p_2(4)$, 0 is generated. As this word does not contain enough valid data bits to form a valid de-interleaved output word 22, it is stored in the pre-output register 60 and processing returns to step 74, for the multiplexer 46 to deliver its output for the case a=4. Appropriate masking and bit shifting, defined by the controller 40 in accordance with the contents of the pre-output register 60, produce, at the output of the AND gate 54, an eight bit word containing seven bits of value 0 followed by the valid data bit $p_3(0)$. When this word is combined with the contents of the pre-output register 60 in the OR gate 58, a word containing the bits $p_1(3)$, $p_1(4)$, $p_2(0)$, $p_2(1)$, $p_2(2)$, $p_2(3)$, $p_2(4)$, $p_3(0)$ is generated. As this is a valid de-interleaved output word 22, it is output at step 94.

This process is repeated such that valid de-interleaved output words are generated from the contents of the memory 12. It will be appreciated that the bit masks used at steps 82 and 88 and the bit shifting applied at step 84 will vary depending upon the number and position of the data bits that are required to generate the de-interleaved output word 22. It will be apparent to those skilled in the art that the controller 40 can be programmed to calculate the required bit masks and bit shifting, and thus these calculations will not be described in detail here.

The logic network 16 illustrated in FIG. 4 may be synchronised to a clock signal, such that operations are performed synchronously. A difficulty with this approach, however, is that it may take more than one clock cycle to generate a de-interleaved output word 22, as a de-interleaved output word may require data bits from two or more rows of the two-dimensional word 44, whilst the multiplexer 46 is only able to read one row per clock cycle, as is shown in the example described above.

Figure 6:
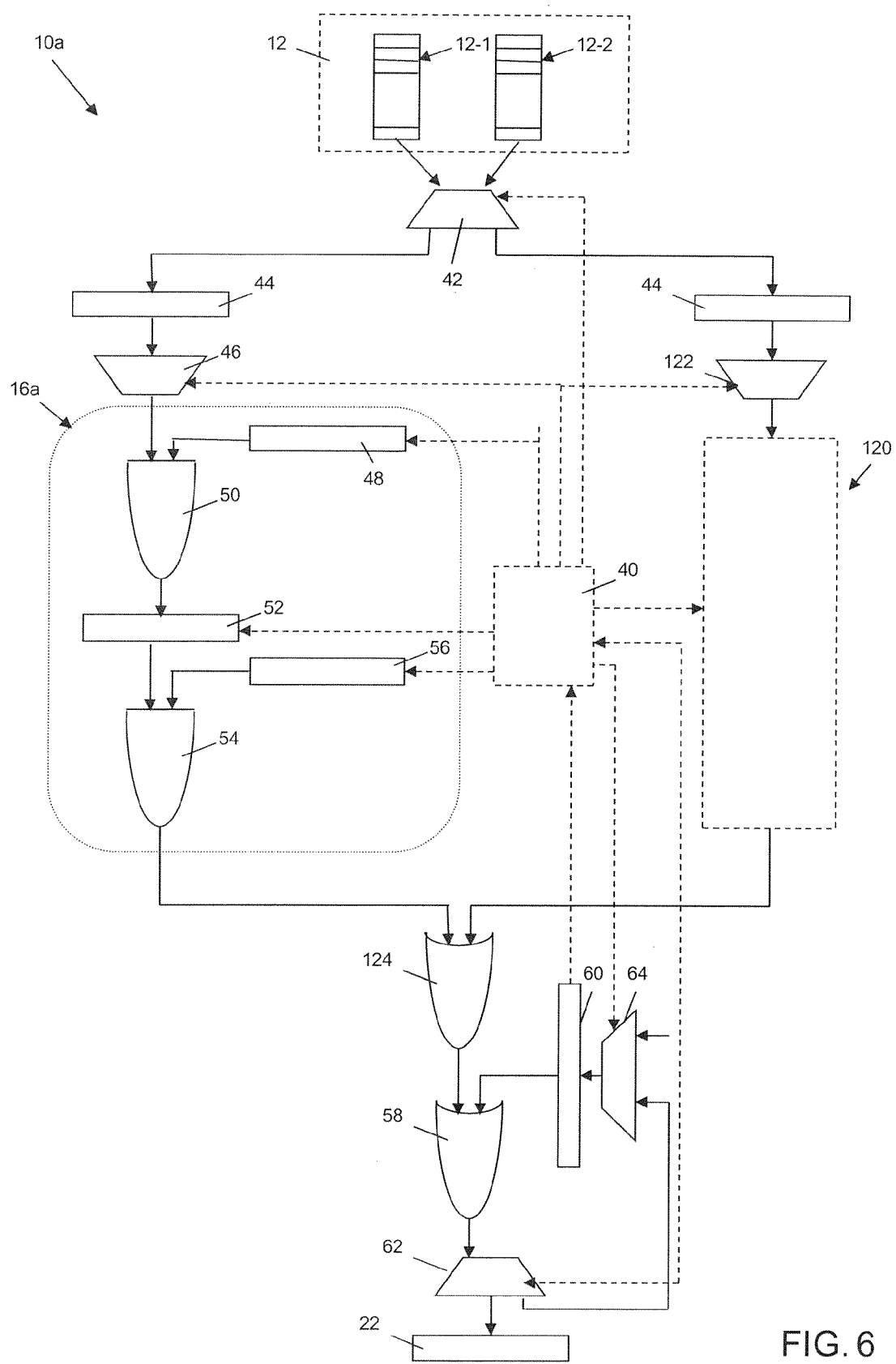
FIG. 6 is a schematic diagram illustrating a modified version of the logic network of FIG. 4.

In the alternative embodiment shown in FIG. 6, the apparatus 10a includes a second logic network, shown generally at 120. This logic network 120 is identical to an upper part 16a (which may be regarded as a separate marshalling logic circuit) of the logic network 16 described above in relation to the embodiment shown in FIG. 4, in that it contains logic elements for masking and rotating data bits read from the sequence 44 by a multiplexer 122 to select and position correctly data bits that are required to generate a de-interleaved output word 22. The second logic network 120 is controlled by the controller 40, and the multiplexer 122 is configured to read and process the second eight bit word which in the first embodiment was produced by the second multiplexer 46.

Thus, when the second multiplexer 46 produces the first eight bit word, which contains the first and every eighth subsequent bit of the sequence 44, the multiplexer 122 produces the second eight bit word, containing the second and every eighth subsequent bit of the sequence 44. These two words are processed in parallel under the control of the controller 40 as described above with reference to the flow chart of FIG. 5, to select and correctly position the data bits required to generate a de-interleaved output word 22. The data bits so selected are combined in an OR gate 124 and either output by the demultiplexer 62, if a valid de-interleaved output word 22 has been generated, or stored in the pre-output register 60 if additional data bits are required to generate a valid de-interleaved output word 22.

It will be appreciated that the embodiment of FIG. 6 allows a de-interleaved output word 22 to be generated in a single clock cycle, where the data bits from which the de-interleaved output word 22 is formed occupy certain positions in the sequence 44.

It is to be noted that in architecture 10a, multiplexer 42 acts both as a multiplexer (in selecting the source of the data) and as a demultiplexer (in selecting the destination of the data). As used herein, multiplexer is used broadly to refer to a multiplexer, demultiplexer, or a combined multiplexer and demultiplexer.

The architecture 10 has been described above as an architecture for an ASIC. However, it will be apparent to those skilled in the relevant art that the architecture 10 could be implemented in any suitable device, such as an FPGA, PLD or the like.

The architecture 10 has been described as performing an interleaving process. However, architecture 10 can be understood equally well as performing a de-interleaving process, since both interleaving and de-interleaving are simply the reordering of a data sequence from an original order to a new order in accordance with a predetermined reordering pattern.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An apparatus for producing a word of a de-interleaved sequence of bits from a sequence of bits stored in a memory, the apparatus comprising:
   a read circuit for selecting bits of the sequence of bits stored in the memory and forming the selected bits into an intermediate word; and
   a logic network arranged to produce the word of the de-interleaved sequence by concatenating sections of a plurality of intermediate words produced by the read circuit.

2. An apparatus according to claim 1, wherein a section of the intermediate word produced by the read circuit which is not used to produce the word of the de-interleaved sequence is stored for use in producing a later word of the de-interleaved sequence.

3. An apparatus according to claim 1, wherein the memory is spread over a plurality of separate memory instances.

4. An apparatus according to claim 1, wherein the logic network comprises:
   a marshalling logic circuit for selecting and positioning bits to be de-interleaved; and a concatenation logic circuit for concatenating the bits selected by the marshalling logic circuit to produce the word of the de-interleaved sequence.

5. An apparatus according to claim 4, wherein the marshalling logic circuit comprises a masking element for selecting bits to be de-interleaved.

6. An apparatus according to claim 4, wherein the marshalling logic circuit comprises a shifting element for shifting bits to be de-interleaved.

7. An apparatus according to claim 4, wherein the concatenation logic circuit comprises a register for storing a section of the intermediate word formed by the read circuit which is not used to produce the word of the de-interleaved sequence.

8. An apparatus according to claim 5, wherein the marshalling logic circuit comprises a further masking element for selecting positioned bits.

9. An apparatus according to claim 1, wherein the logic network comprises a plurality of marshalling logic circuits, each marshalling logic circuit being configured to select and position bits of a different word formed by the read circuit.

10. An apparatus according to claim 9, wherein each of the marshalling logic circuits is substantially identical.

11. A method of producing a word of a de-interleaved sequence of bits from a stored sequence of bits, the method comprising:
selecting bits of the stored sequence and forming the selected bits into an intermediate word; and
concatenating sections of a plurality of intermediate words so formed to produce the word of the de-interleaved sequence.

12. A method according to claim 11, wherein a section of the intermediate word formed from the stored sequence of bits which is not used to produce the word of the de-interleaved sequence is stored for use in producing a later word of the de-interleaved sequence.

13. A method according to claim 11, wherein the stored sequence of bits is stored in a memory which is spread over a plurality of separate memory instances.

14. A method according to claim 11, wherein:
bits to be de-interleaved are selected and positioned by a marshalling logic circuit; and
the bits selected by the marshalling logic circuit are concatenated by a concatenation logic circuit to produce the word of the de-interleaved sequence.

15. A method according to claim 14, wherein bits to be de-interleaved are selected by a masking element.

16. A method according to claim 14, wherein the bits to be de-interleaved are positioned by a shifting element.

17. A method according to claim 14, wherein a section of the intermediate word formed by the read circuit which is not used to produce the word of the de-interleaved sequence is stored in a register of the marshalling logic circuit.

18. A method according to claim 15, wherein positioned bits are selected by a further masking element.

19. A method according to claim 11, wherein a plurality of marshalling logic circuits are operative to select and position bits of a different word formed from the stored sequence.

20. A method according to claim 19, wherein each of the marshalling logic circuits is substantially identical.

21. An apparatus for producing a word of length s bits of a de-interleaved version of a data block comprising a series of original words of length p bits, the apparatus comprising:
a) a memory arranged to store the data block;
b) a read circuit arranged to read, from the memory, a bit of an original word at an end of the series, read each succeeding $p^{th}$ bit in the series to read s bits altogether and deliver the s bits as an intermediate word; and
c) a logic network arranged to concatenate sections of intermediate words delivered by the read circuit to produce said word of the de-interleaved version of said data block.

22. A method of producing a word of length s bits of a de-interleaved version of a data block comprising a series of original words of length p bits, the method comprising:
a) storing the data block in a memory;
b) reading, from the memory, a bit of an original word at an end of the series, reading each succeeding $p^{th}$ bit in the series to read s bits altogether and delivering the s bits as an intermediate word; and
c) concatenating sections of intermediate words to produce said word of the de-interleaved version of said data block.

* * * * *